(12) United States Patent
Iy et al.

(10) Patent No.: US 9,625,522 B2
(45) Date of Patent: Apr. 18, 2017

(54) ADAPTOR STRUCTURE AND APPARATUS FOR TESTING A SEMICONDUCTOR PACKAGE INCLUDING THE SAME

(71) Applicant: Samsung Electronics Co., Ltd., Suwon-si (KR)

(72) Inventors: Hyun-Guen Iy, Chungcheongnam-do (KR); Bo-Seong Park, Chungcheongnam-do (KR)

(73) Assignee: Samsung Electronics Co., Ltd. (KR)

( * ) Notice: Subject to any disclaimer, the term of this patent is extended or adjusted under 35 U.S.C. 154(b) by 137 days.

(21) Appl. No.: 14/725,512

(22) Filed: May 29, 2015

(65) Prior Publication Data
US 2016/0124042 A1  May 5, 2016

(30) Foreign Application Priority Data
Oct. 31, 2014  (KR) ........................ 10-2014-0149689

(51) Int. Cl.
| | | |
|---|---|---|
| *G01R 31/00* | (2006.01) | |
| *G01R 31/28* | (2006.01) | |
| *G01R 31/26* | (2014.01) | |
| *G01R 1/04* | (2006.01) | |
| *G01R 1/073* | (2006.01) | |

(52) U.S. Cl.
CPC ....... *G01R 31/2889* (2013.01); *G01R 1/0433* (2013.01); *G01R 1/0466* (2013.01); *G01R 31/2601* (2013.01); *G01R 31/2891* (2013.01); *G01R 1/07314* (2013.01); *G01R 31/2896* (2013.01)

(58) Field of Classification Search
CPC .............. G01R 1/0466; G01R 1/07314; G01R 31/2879; G01R 31/2886; G01R 31/2889; G01R 31/2896
USPC ......... 324/71, 378, 403, 415, 425, 500, 537, 324/756.01, 756.02
See application file for complete search history.

(56) References Cited

U.S. PATENT DOCUMENTS

| 6,711,810 B2 | 3/2004 | Buley et al. |
|---|---|---|
| 6,776,643 B2 | 8/2004 | Nakano |

(Continued)

FOREIGN PATENT DOCUMENTS

| JP | 2004055357 | 2/2004 |
|---|---|---|
| JP | 2005345271 | 12/2005 |

(Continued)

*Primary Examiner* — Jermele M Hollington
*Assistant Examiner* — Raul Rios Russo
(74) *Attorney, Agent, or Firm* — Onello & Mello, LLP

(57) ABSTRACT

An adaptor structure includes a main adaptor, a first sub-adaptor, a second sub-adaptor and a first driving mechanism. The main adaptor is over a socket. The main adaptor has an opening. The first sub-adaptor is movably received in the opening of the main adaptor in a first direction. The first sub-adaptor is configured to support a first side surface of the semiconductor package. The second sub-adaptor is movably received in the opening of the main adaptor in the first direction and a second direction. The second sub-adaptor faces the first sub-adaptor to support a second side surface of the semiconductor package. The first driving mechanism is configured to move the second sub-adaptor in the second direction. Thus, the adaptor structure can guide the semiconductor packages having different sizes to the socket.

20 Claims, 11 Drawing Sheets

(56) References Cited

U.S. PATENT DOCUMENTS

| | | |
|---|---|---|
| 7,355,426 B2 | 4/2008 | Ahmad et al. |
| 7,578,678 B2 | 8/2009 | Xie et al. |
| 8,602,805 B2 | 12/2013 | Takahashi et al. |
| 2003/0114034 A1* | 6/2003 | Sano .................. H01R 13/2485 439/331 |
| 2008/0186046 A1* | 8/2008 | Yun ..................... G01R 1/0441 324/756.02 |
| 2009/0128177 A1 | 5/2009 | Ohta |
| 2010/0134998 A1 | 6/2010 | Klyota et al. |
| 2010/0248518 A1* | 9/2010 | Takahashi .......... H01R 12/7076 439/331 |
| 2013/0113513 A1 | 5/2013 | Seo |

FOREIGN PATENT DOCUMENTS

| | | |
|---|---|---|
| JP | 2012164434 | 8/2012 |
| KR | 0273982 | 12/2000 |
| KR | 0871378 | 10/2008 |
| KR | 0510501 | 3/2011 |
| KR | 1222505 | 3/2011 |
| KR | 1279019 | 6/2013 |
| KR | 2013133951 | 12/2013 |

* cited by examiner

THIRD
DIRECTION ↑
→ SECOND
DIRECTION

ADAPTOR STRUCTURE AND APPARATUS FOR TESTING A SEMICONDUCTOR PACKAGE INCLUDING THE SAME

CROSS-REFERENCE TO RELATED APPLICATIONS

This application claims priority under 35 USC §119 to Korean Patent Application No. 10-2014-0149689, filed on Oct. 31, 2014 in the Korean Intellectual Property Office, the entire contents of which are hereby incorporated herein by reference.

FIELD OF THE INVENTION

The present disclosure relates to a test apparatus. More specifically, the present disclosure relates to a test apparatus with an adaptor structure for receiving and electrically testing a semiconductor device.

BACKGROUND

Various semiconductor fabrication processes may be used to make semiconductor devices "(chips"). To mount the semiconductor chips on a printed circuit board (PCB), a packaging process is used on the semiconductor chip to form a semiconductor package. Electrical characteristics of the semiconductor package may be tested using a test apparatus.

The test apparatus may include a socket and an adaptor. The socket may include socket pins configured to electrically make contact with the semiconductor package. The adaptor may guide the semiconductor package to the socket to contact external terminals of the semiconductor package with the socket pins.

According to the related arts, the adaptor may be a fixed type having a fixed size, (e.g. the size of the adaptor may not be changed). Thus, semiconductor packages having different sizes may not be used with the same fixed type adaptor. A plurality of adaptors having different sizes may be used in accordance with the different sizes of the semiconductor packages. As a result, when the semiconductor package under test is replaced with a new semiconductor package, the adaptor may have to be changed to one having a corresponding size to fit the new semiconductor package. Changing test adaptors undesirably extends test time.

Furthermore, when the semiconductor package is loaded into or unloaded from the socket, the semiconductor package may collide with the test adaptor (e.g. socket), if the appropriately sized socket is not used, thus causing damage to both the semiconductor package and the socket.

SUMMARY

The inventive concepts provide for an adaptor structure that may be used for testing semiconductor packages having different sizes without collisions between the semiconductor packages and a socket.

The inventive concepts also provided for an apparatus for testing a semiconductor package including the above-mentioned adaptor structure.

According to an aspect of the inventive concept an adaptor structure comprises a main adaptor over a socket for testing a semiconductor package. The main adaptor has an opening configured to expose the socket. A first sub-adaptor is movably received in the opening of the main adaptor in a first direction along which the semiconductor package may be loaded into the socket. The first sub-adaptor is configured to support a first side surface of the semiconductor package. The second sub-adaptor is movably received in the opening of the main adaptor in the first direction and a second direction substantially perpendicular to the first direction and towards the first sub-adaptor. The second sub-adaptor faces the first sub-adaptor to support a second side surface of the semiconductor package opposite to the first side surface. The first driving mechanism is configured to move the second sub-adaptor in the second direction.

According to an aspect of the inventive concept, the first sub-adaptor comprises a first supporting portion extended from a first side surface of the first sub-adaptor in the second direction to support a third side surface of the semiconductor package connected between the first side surface and the second side surface of the semiconductor package. A second supporting portion extends from a second side surface of the first sub-adaptor opposite to the first side surface of the first sub-adaptor to support a fourth side surface of the semiconductor package connected between the first side surface and the second side surface of the semiconductor package and is opposite to the third side surface of the semiconductor package.

According to an aspect of the inventive concept, the second sub-adaptor comprises a third supporting portion extended from a first side surface of the second sub-adaptor in the second direction to support the third side surface of the semiconductor package.

According to an aspect of the inventive concept, the second sub-adaptor further comprises a fourth supporting portion extended from a second side surface of the second sub-adaptor opposite to the first side surface of the second sub-adaptor in the second direction to support the fourth side surface of the semiconductor package.

According to an aspect of the inventive concept, the first driving mechanism comprises a link movably received in the main adaptor in the first direction. The link includes a lower end configured to selectively make contact with the socket and a tapered upper end. A pusher is extended from the second sub-adaptor in the second direction. The pusher is configured to make contact with the tapered upper end of the link to move the second sub-adaptor in the second direction in response to movement of the link in the first direction.

According to an aspect of the inventive concept, the adaptor further comprises a return spring connected between the main adaptor and the second sub-adaptor to provide the second sub-adaptor with a restoring force in the first direction.

According to an aspect of the inventive concept, the adaptor further comprises a first magnet on the main adaptor. The second magnet is on the second sub-adaptor. The first magnet and the second magnet generate a repulsive force to provide the second sub-adaptor with a repulsive force in the first direction.

According to an aspect of the inventive concept, the first sub-adaptor is movably received in the opening of the main adaptor in the second direction. The adaptor structure is further include a second driving mechanism configured to move the first sub-adaptor in the second direction.

According to an aspect of the inventive concept, the second driving mechanism has a structure substantially the same as that of the first driving mechanism.

According to an aspect of the inventive concept, the adaptor further comprises a third sub-adaptor movably arranged in the opening of the main adaptor in a third direction substantially perpendicular to the first and second directions. The third sub-adaptor is substantially perpendicular to the first and second sub-adaptors to support the third side surface of the semiconductor package. The third driving mechanism is configured to move the third sub-adaptor in the third direction. The fourth sub-adaptor is movably arranged in the opening of the main adaptor in the third direction. The fourth sub-adaptor faces the third sub-adaptor to support the fourth side surface of the semiconductor package.

According to an aspect of the inventive concept, the third driving mechanism and the fourth driving mechanism may have a structure substantially the same as that of the first driving mechanism.

According to an aspect of the inventive concept, the main adaptor comprises a push block configured to move the socket in the first direction.

According to an aspect of the inventive concept, a test apparatus comprises a socket configured to test a semiconductor package. The main adaptor is over the socket. The main adaptor has an opening configured to expose the socket. The first sub-adaptor is movably received in the opening of the main adaptor in a first direction along which the semiconductor package is loaded into the socket. The first sub-adaptor is configured to support a first side surface of the semiconductor package. The second sub-adaptor is movably received in the opening of the main adaptor in the first direction and a second direction substantially perpendicular to the first direction and towards the first sub-adaptor. The second sub-adaptor faces the first sub-adaptor to support a second side surface of the semiconductor package opposite to the first side surface. The adaptor-driving mechanism is configured to move the second sub-adaptor in the second direction.

According to an aspect of the inventive concept, the socket comprises a socket body. A socket pin is movably connected to the socket body in the second direction to selectively make contact with the semiconductor package. The socket cover is movably connected to the socket body in the first direction. The socket cover is pressed by the main adaptor to contact the semiconductor package with the socket pin and operates the adaptor-driving mechanism. The socket-driving mechanism is configured to move the socket pin in the second direction by a contact between the socket cover and the socket-driving mechanism.

According to an aspect of the inventive concept, the socket-driving mechanism comprises a link including an upper end connected to the socket cover and a tapered lower end extended from the upper end in the first direction. A pusher is connected to the socket pin. The pusher is configured to move the socket pin in the second direction by a contact between the pusher and the tapered lower end of the link.

According to an aspect of the inventive concept, the adaptor structure includes the separated first and sub-adaptors. Furthermore, the second sub-adaptor is movably received in the opening of the main adaptor in the first and second directions. Thus, the adaptor structure is capable of guiding the semiconductor packages having different sizes to the socket. Furthermore, the second sub-adaptor may have various positions in first to third directions so that the semiconductor package does not collide with the adaptor structure.

According to an aspect of the inventive concept a test apparatus comprises a socket including at least one pair of socket pins configured to electrically contact opposing sides of a respective one of a plurality of electrical terminals on a semiconductor package. Each pair of socket pins includes a respective fixed pin and a respective movable pin. An adaptor is substantially collinear to the socket including a first contact surface separated from a second contact surface by an opening configured to receive the semiconductor package. The second contact surface is configured to move towards the first contact surface to contact the semiconductor package on a second side opposing a first side contacted by the first contact surface. The respective movable pin is moved by a compressive force on the socket from the adaptor, and the second surface is moved by the compressive force on the adaptor from the socket.

According to an aspect of the inventive concept, the movable pin is moved in a direction orthogonal to the compressive force on the socket from the adaptor by a tapered link moving parallel to the compressive force.

According to an aspect of the inventive concept, the second surface is moved in a direction orthogonal to the compressive force on the adaptor from the socket by a tapered link moving parallel to the compressive force.

According to an aspect of the inventive concept, the second contact surface is configured to move towards the first contact surface by a tapered link moving parallel to the compressive force.

According to an aspect of the inventive concept, the opening includes a third contact surface and a fourth contact surface. The third contact surface is configured to move towards a third side of the semiconductor package by a third tapered link moving parallel to the compressive force. The fourth contact surface is configured to move towards a fourth side of the semiconductor package by a fourth tapered link moving parallel to the compressive force.

BRIEF DESCRIPTION OF THE DRAWINGS

Example embodiments will be more clearly understood from the following detailed description taken in conjunction with the accompanying drawings.

DETAILED DESCRIPTION

Figure 1:
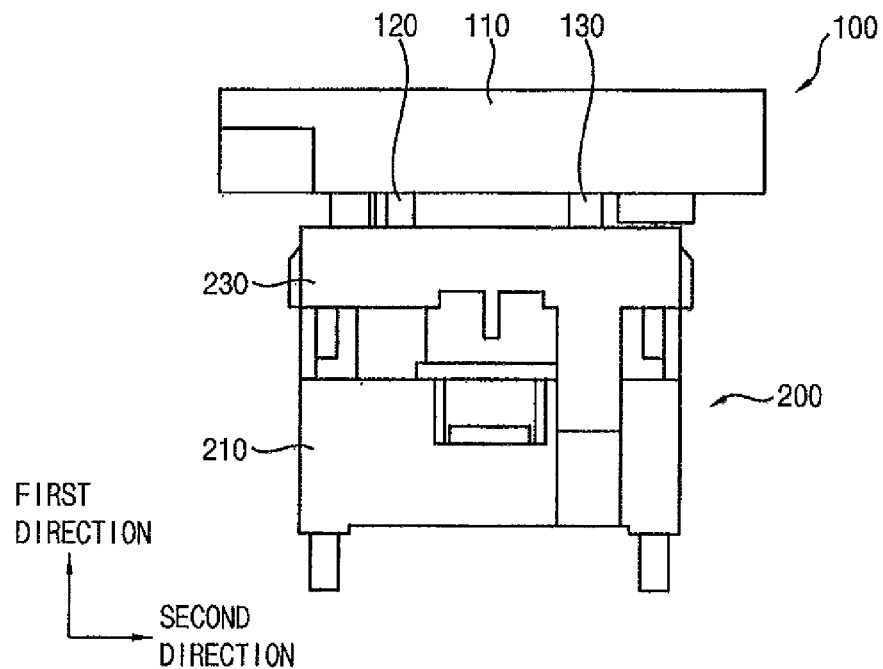
FIG. 1 is a front view of an apparatus for testing a semiconductor package in accordance with example embodiments.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items, It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the Referring to FIG. 1, an apparatus for testing a semiconductor package in accordance with this example embodiment may include an adaptor 100 and a socket 200. The socket 200 may include socket pins configured to make electrical contact with the semiconductor package. The adaptor structure 100 may be positioned over the socket 200. The adaptor structure 100 may guide the semiconductor package into the socket 200 to electrically contact external terminals of the semiconductor package with the socket pins of the socket 200. The semiconductor package may be loaded into the adaptor 100 in a first direction corresponding to a vertical direction. The semiconductor package may have a first side surface, a second side surface opposite to the first side surface, a third side surface connected between the first side surface and the second side surface, and a fourth side surface connected between the first side surface and the second side surface and being opposite to the third side surface.

With reference to FIG. 2 through FIG. 5, the adaptor 100 may include a main adaptor 110, a first sub-adaptor 120, a second sub-adaptor 130, a push block 140, and an adaptor-driving mechanism 150.

The main adaptor 110 may have an opening 112 into which the semiconductor package may be loaded. The opening 112 may be formed through a central portion of the main adaptor 110 in the first direction. The opening 112 may have a rectangular parallelepiped shape. Thus, the opening 112 may have a first side surface, a second side surface opposite to the first side surface, a third side surface connected between the first side surface and the second side surface, and a fourth side surface connected between the first side surface and the second side surface and being opposite to the third side surface. The first to fourth side surfaces of the opening 112 may correspond to the first to fourth side surfaces of the semiconductor package, respectively. Furthermore, the main adaptor 110 may include guide shafts formed at corners of the opening 112 in the first direction.

The first sub-adaptor 120 may be arranged adjacent to the first side surface of the opening 112 of the main adaptor 110. The first sub-adaptor 120 may include a guide block 126 movably connected to the guide shafts in the first direction. Thus, the first sub-adaptor 120 may be movably connected with the main adaptor 110 in the first direction. In contrast, the first sub-adaptor 120 may not be moved in a second direction substantially perpendicular to the first direction. The first sub-adaptor 120 may support the first side surface of the semiconductor package.

The first sub-adaptor 120 may include a first supporting portion 122 and a second supporting portion 124. The first supporting portion 122 may be extended from a first side surface of the first sub-adaptor 120 in the second direction. The first supporting portion 122 may support the third side surface of the semiconductor package. The second supporting portion 124 may be extended from a second side surface of the first sub-adaptor 120 opposite to the first side surface of the first sub-adaptor 120 in the second direction. The second supporting portion 124 may support the fourth side surface of the semiconductor package. The first supporting portion 122 and the second supporting portion 124 may be integrally formed with the first sub-adaptor 120.

The second sub-adaptor 130 may be arranged adjacent to the second side surface of the opening 112 of the main adaptor 110. The second sub-adaptor 130 may not be secured to the main adaptor 110. The second sub-adaptor 130 may be moved in the opening 112 of the main adaptor 110 along the first direction and the second direction. The second sub-adaptor 130 may be moved by the adaptor-driving mechanism 150 in the second direction.

The second sub-adaptor 130 may include a third supporting portion 132. The third supporting portion 132 may be extended from a first side surface of the second sub-adaptor 130 in the second direction. The third supporting portion 132 may support the third side surface of the semiconductor package. Thus, the third side surface of the semiconductor package may be supported by the first supporting portion 122 and the third supporting portion 132.

The push block 140 may be arranged on a lower surface of the main adaptor 110. The push block 140 may press the socket 200 to operate the adaptor-driving mechanism 150.

Figure 6A:
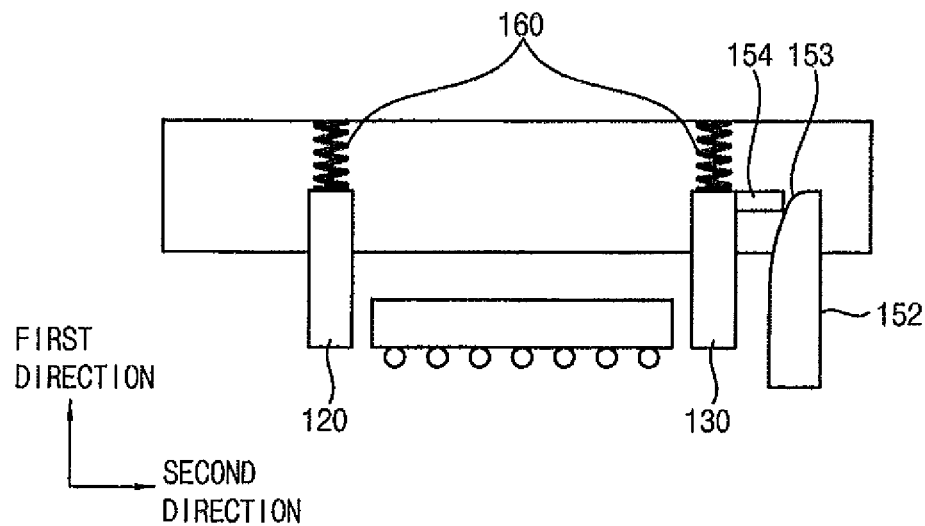
FIG. 6A is a partial side view of a semiconductor package and the adaptor in FIG. 2.

Referring to FIG. 6A, the adaptor-driving mechanism 150 may include a link 152 and a pusher 154. The link 152 may be movably connected to the main adaptor 110 in the first direction. The link 152 may have a lower and a tapered upper end 151 The lower end of the link 152 may selectively make contact with the socket 200. The tapered upper end 153 of the link 152 may be positioned in the main adaptor 110. The tapered upper end 153 of the link 152 may have a gradually reduced width in the first direction. The lower end of the link 152 may be positioned higher than a lower surface of the push block 140. Thus, the push block 140 may make contact with the socket 200 prior to the lower end of the link 152 contacting the socket 200.

The pusher 154 may be extended from the second sub-adaptor 130 in the second direction. The pusher 154 may make contact with the tapered upper end 153 of the link 152. Thus, when the link 152 moved upward (along the first direction), the pusher 154 may be gradually moved from an upper portion of the tapered upper end 153 to a lower portion of the tapered upper end 153 so that the pusher 154 may be moved toward the first sub-adaptor 120 in the second direction. The second sub-adaptor 130, being connected to the pusher 154 consequently will also move toward the first sub-adaptor 120 in the second direction. In contrast, when the link 152 is moved downward (along the first direction), the pusher 154 may be gradually moved from the lower portion of the tapered upper end 153 to the upper portion of the tapered upper end 153 so that the pusher 154 may be moved opposite to the first sub-adaptor 120 in the second direction. The second sub-adaptor 130 will consequently be moved opposite to the first sub-adaptor 120 in the second direction. The upward or downward movement of the link 152 thus provides a mechanism for the first support portion 120 and the second support portion 130 to grip or release a semiconductor package.

To return the first sub-adaptor 120 and the second sub-adaptor 130 in the first direction, a return spring 160 may be connected between the main adaptor 110 and the first and second sub-adaptors 120 and 130 respectively. The return spring 160 may include a tensile spring configured to resiliently press the first sub-adaptor 120 and the second sub-adaptors 130 toward the socket 200.

Figure 6B:
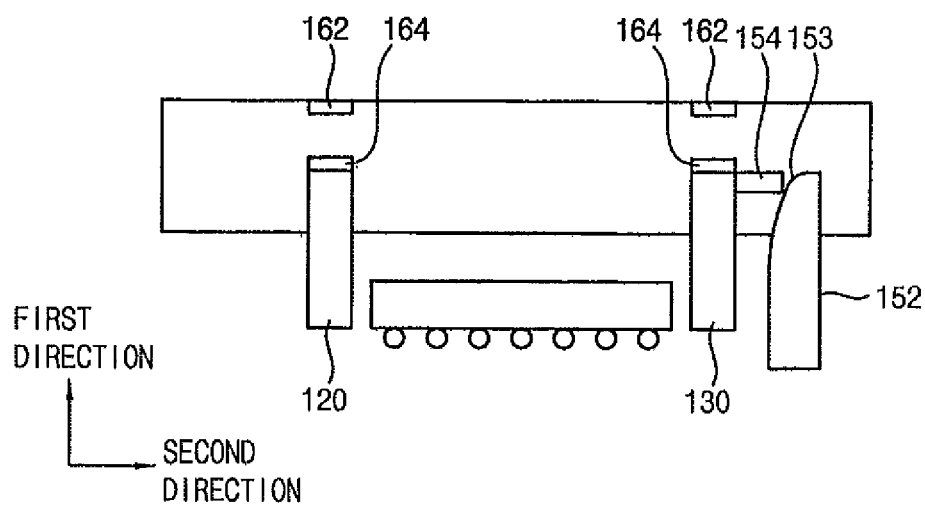
FIG. 6B is a partial side view of a semiconductor package and an adaptor in accordance with example embodiments.

Referring to FIG. 6B, the first sub-adaptor 120 and the second sub-adaptor 130 may be returned in the first direction using a magnetic force in place of the spring force. A first magnet 162 may be attached to the main adaptor 110. The second adaptors 164 may be attached to the first and second sub-adaptors 120 and 130 respectively. Because the first sub-adaptor 120 and the second sub-adaptor 130 may be moved toward the socket 200, a repulsive force may act between the first magnet 162 and the second magnet 164. The first magnet 162 and the second magnet 164 may have substantially the same polarity, either both magnetically North or both magnetically South.

Figure 7:
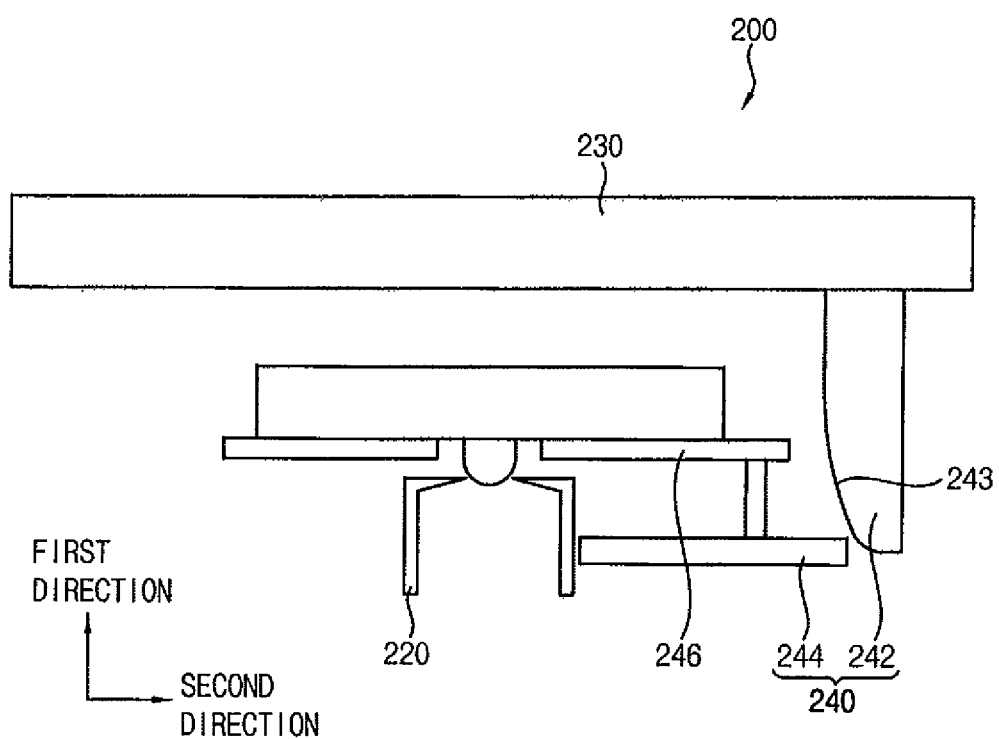
FIG. 7 is a partial side view of a socket of the apparatus in FIG. 1.

Referring to FIG. 1 and FIG. 7, the socket 200 may include a socket body 210, socket pin 220, a socket cover 230 and a socket-driving mechanism 240.

The socket body 210 may be arranged under the adaptor 100. The socket body 210 may be configured to receive the semiconductor package guided by the adaptor 100.

The socket pins 220 may be provided in the socket body 210. The socket pins 220 may be configured to make contact with the external terminals of the semiconductor package. A test current may be supplied to the external terminals of the semiconductor package through the socket pin 220.

The socket cover 230 may be movably connected to the socket body 210 in the first direction. When the push block 140 presses against the socket cover 230, the socket cover 230 will be moved downward in the first direction to operate the socket-driving mechanism 240. Furthermore, the link 152 of the adaptor-driving mechanism 150 may be operated by the upward force of the socket cover 230 pressing against the main adaptor 110.

The socket-driving mechanism 240 may include a link 242 and a pusher 244. The link 242 may have an upper end fixed to the socket cover 230, and a tapered lower end 243 positioned in the socket body 210. The tapered lower end 243 of the link 242 may have a gradually reduced width toward the end opposite the socket cover 230.

The pusher 244 may be connected to a seat 246 on which the semiconductor package may be placed. The pusher 244 may be movably arranged in the socket body 210 in the second direction. The pusher 244 may make contact with the tapered lower end 243 of the link 242. Thus, when the link 242 is moved downward, the pusher 244 is moved from a lower portion of the tapered lower end 243 to an upper portion of the tapered lower end 243 so that the pusher 244 moves in the second direction. Because the seat 246 may also move together with the pusher 244, the semiconductor package may also move in the second direction. In contrast, when the link 242 is moved upward, the pusher 244 may be moved from the upper portion of the tapered lower end 243 to the lower portion of the tapered lower end 243 so that the pusher 244 may move to the right in the second direction (e.g. towards the link 242). Because the seat 246 may also be moved together with the pusher 244, the semiconductor package may also move to the right in the second direction, thus returning the semiconductor package to an original position.

Figure 8A:
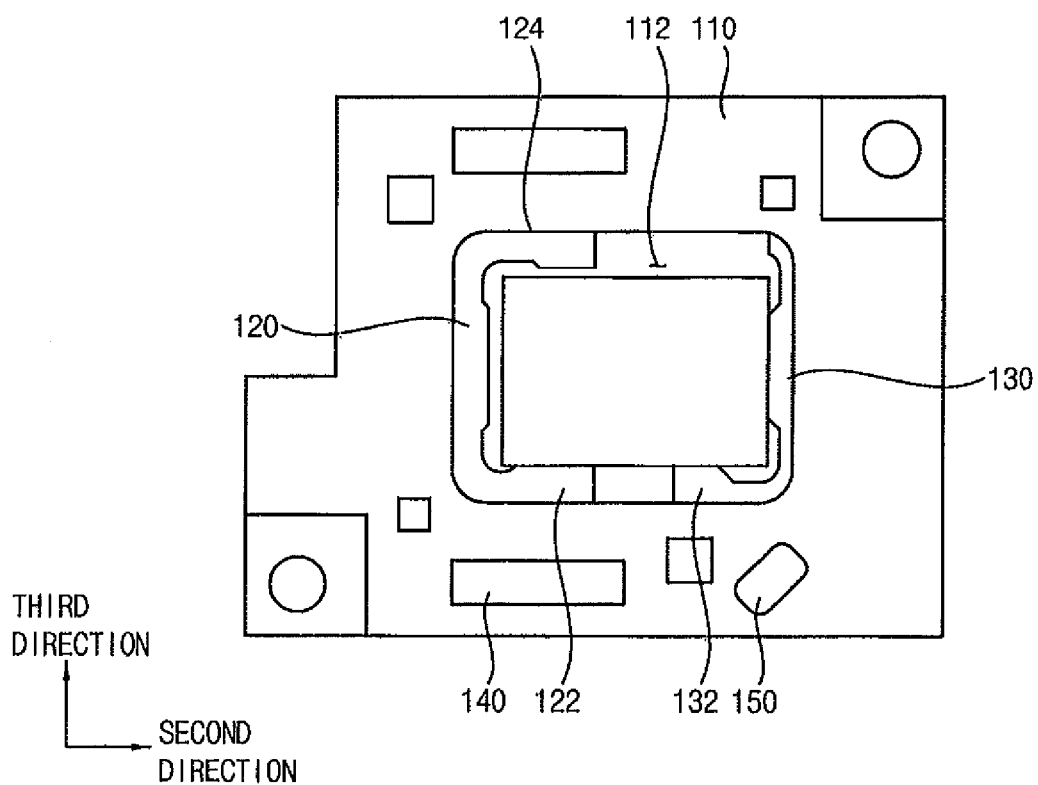
FIG. 8A, FIG. 9A and FIG. 10A are bottom views illustrating operations of the apparatus in FIG. 1.
Figure 8B:
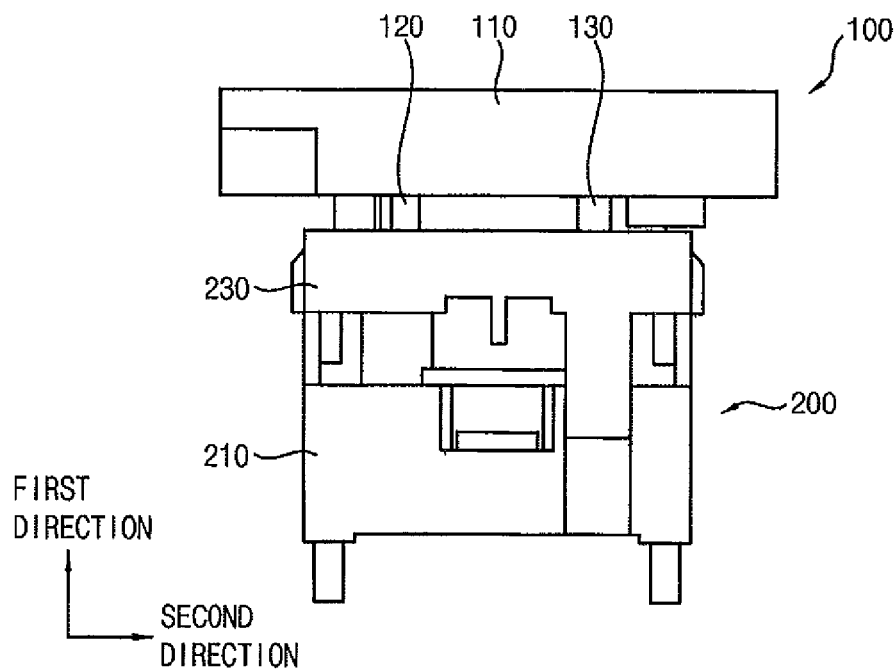
FIG. 8B, FIG. 9B and FIG. 10B are front views illustrating operations of the apparatus in FIG. 1, corresponding to FIG. 8A, FIG. 9A and FIG. 10A respectively.

Referring to FIG. 8A and FIG. 8B, the semiconductor package may be loaded into the opening 112 of the main adaptor 110. The semiconductor package may be placed on an upper surface of the seat 246 of the socket 200. The second sub-adaptor 130 may support the second and third side surfaces of the semiconductor package. In contrast, the first and fourth side surface of the semiconductor package may be spaced apart from the first sub-adaptor 120.

The socket cover 230 being beneath the main adaptor 110, which holds the semiconductor package, may be moved upward relative to the main adaptor 110 (e.g. the socket cover 230 and the main adaptor 110 are brought closer together). Thus, the pusher 244 of the socket-driving mechanism 240 may make contact with the lower portion of the tapered lower end 243 of the link 242.

Figure 9A:
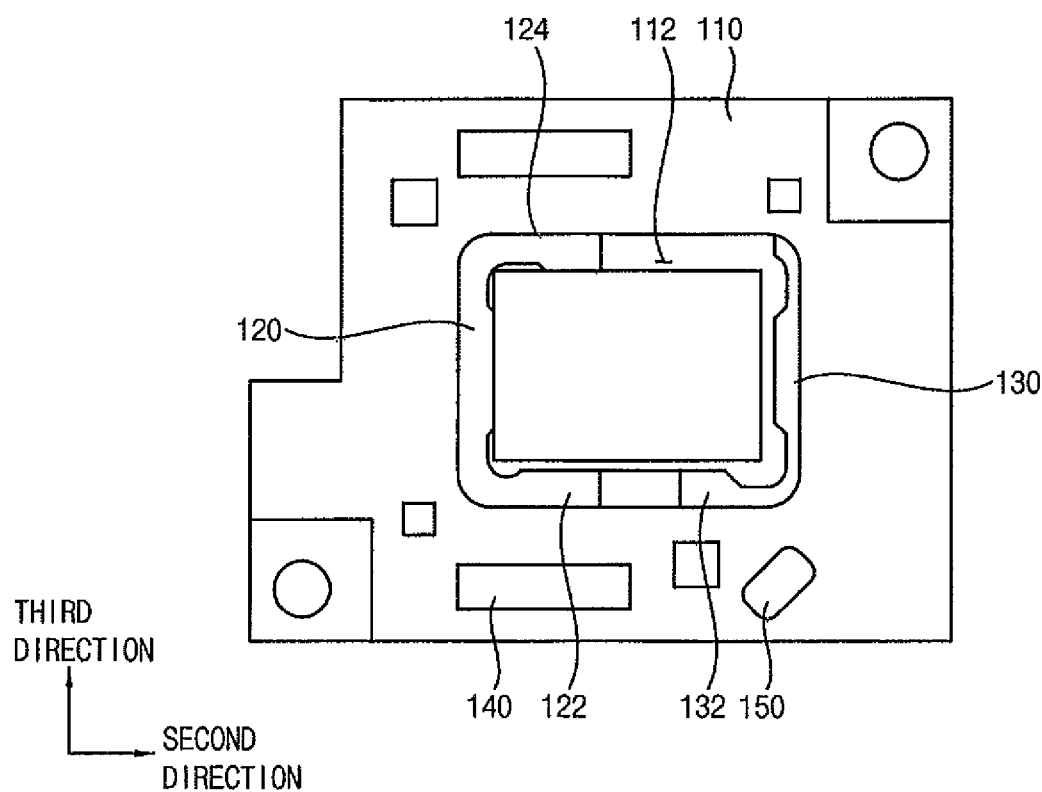
Figure 9B:
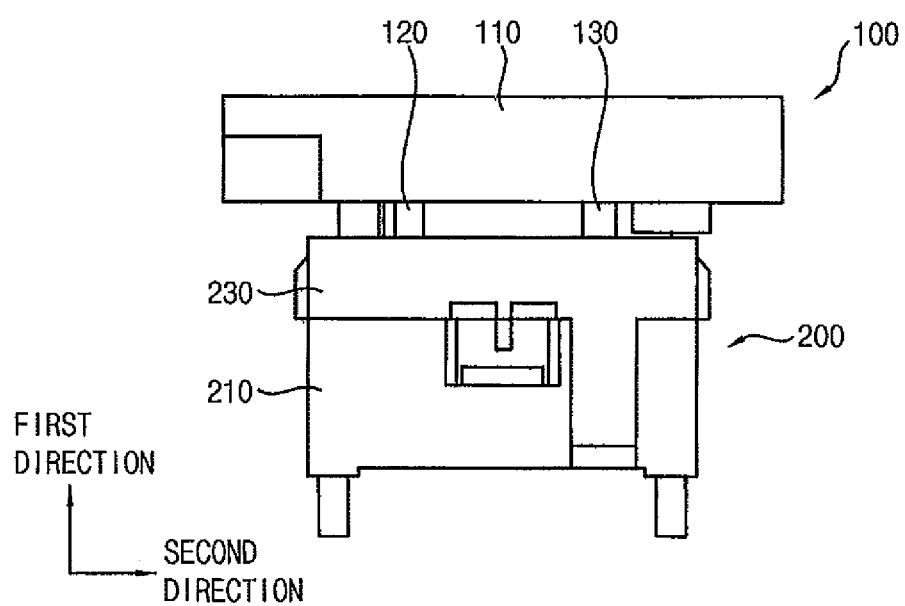

Referring to FIG. 9A and FIG. 9B, the main adaptor 110 may be moved downward towards the socket cover 230. The push block 140 contained in the main adaptor 110 may make contact with the socket cover 230 by the downward movement of the main adaptor 110. When the main adaptor 110 is further moved in the downward direction, the push block 140 may press against the socket 230 so that the socket cover 230 will move downward together with the push block 140. Thus, the link 242 will also move downward together with the socket cover 230 so that the pusher 244 may be moved from the lower portion of the tapered lower end 243 to the upper portion of the tapered lower end 243. Accordingly, the pusher 244 moves left in the second direction and the seat 246 may also be moved left in the second direction. As a result, the semiconductor package will also move to the left in the second direction so that the external terminals of the semiconductor package may make contact with the socket pins 220.

Figure 10A:
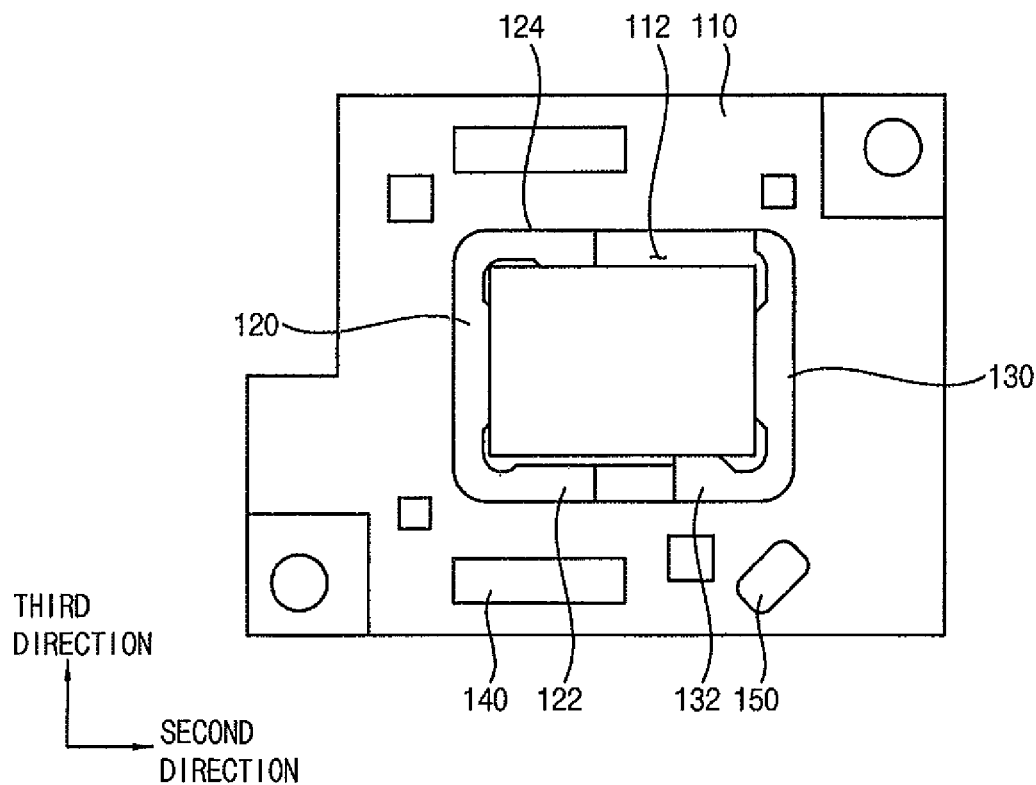
Figure 10B:
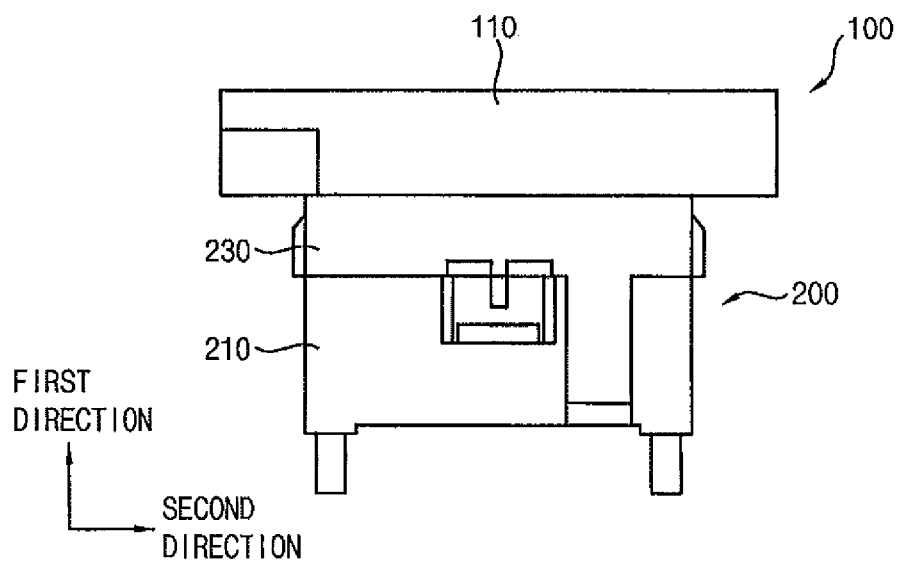

Referring to FIG. 10A and FIG. 10B, when the socket cover 230 is moved downward to the lowermost position, the socket cover 230 may not move any further downward. The socket cover 230 may operated the adaptor-driving mechanism 150. When the lower end of the link 152 makes contact with the socket cover 230, the link 152 will move upward. The pusher 154 may be moved from the lower portion of the tapered upper end 153 to the upper portion of the tapered upper end 153 so that the pusher 154 may move to the left in the second direction. Thus, the second sub-adaptor 130 may also be moved left until the first and fourth side surfaces of the semiconductor package make contact with the first sub-adaptor 120. As a result, the first sub-adaptor 120 and the second sub-adaptor 130 may firmly support the first to fourth side surfaces of the semiconductor package.

The test current may be supplied to the socket pins 220 to test the semiconductor package. After completing the test of the semiconductor package, the first sub-adaptor 120 and the second sub-adaptor 130 may be returned to original positions by the return spring 160, or alternatively by the repeling force of the first magnet 162 and the second magnet 164.

Figure 2:
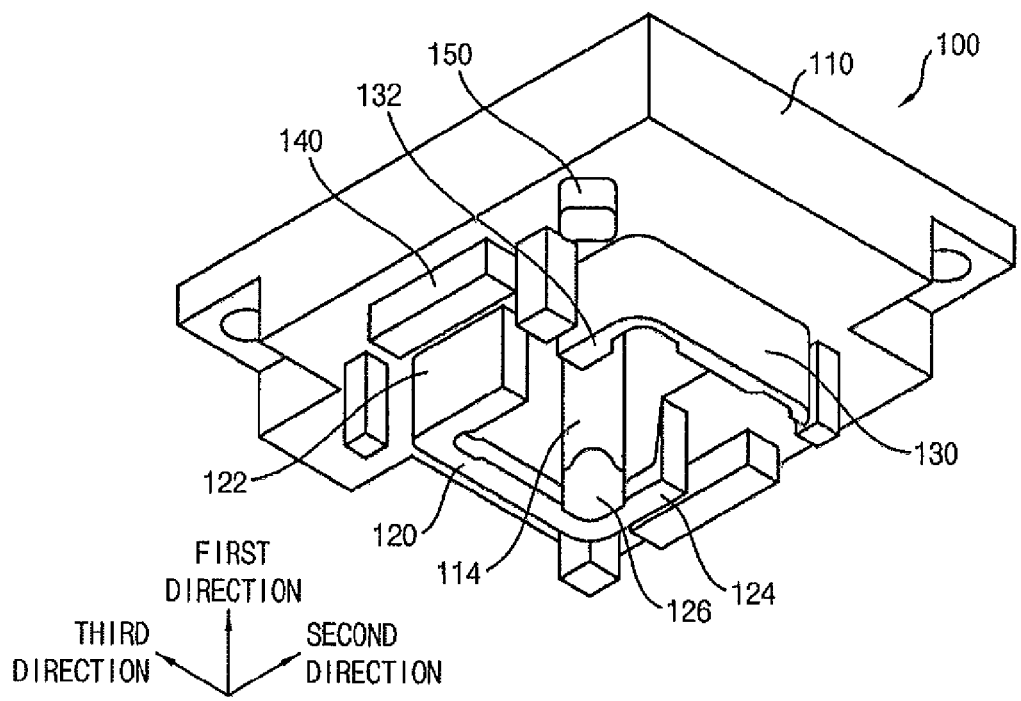
FIG. 2 is a perspective view of a portion of the adaptor structure in FIG. 1.
Figure 3:
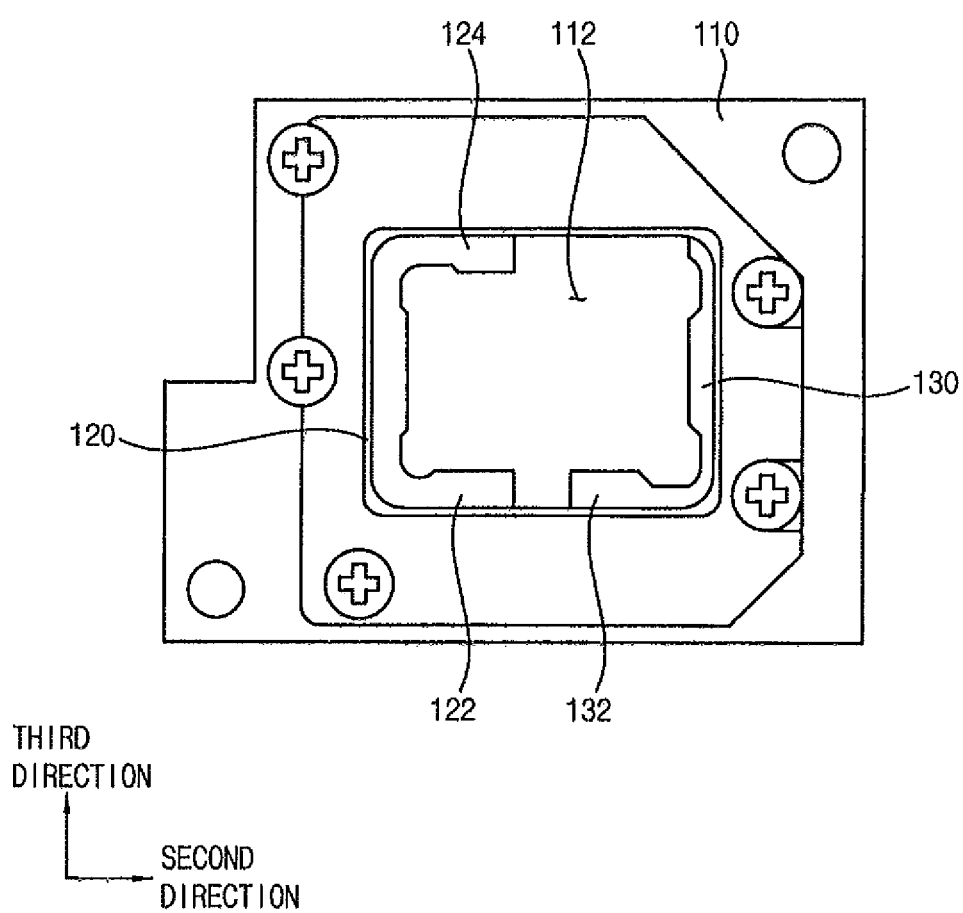
FIG. 3 is a plan view of the adaptor in FIG. 2.
Figure 4:
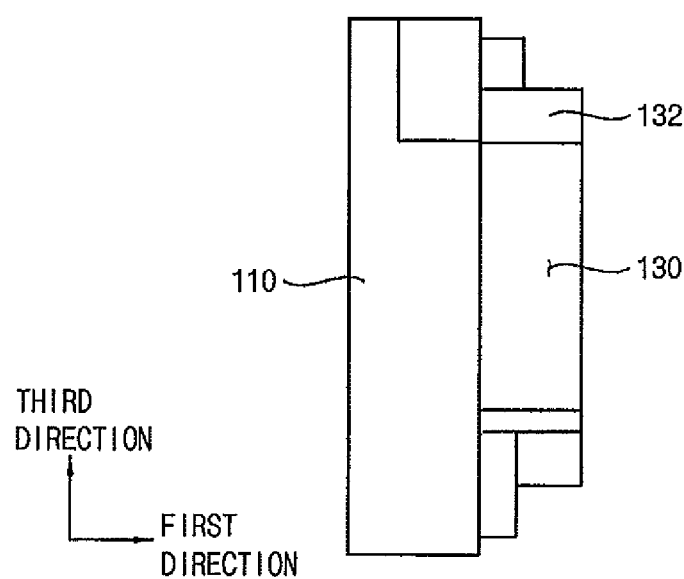
FIG. 4 is a side view of the adaptor in FIG. 2.
Figure 5:
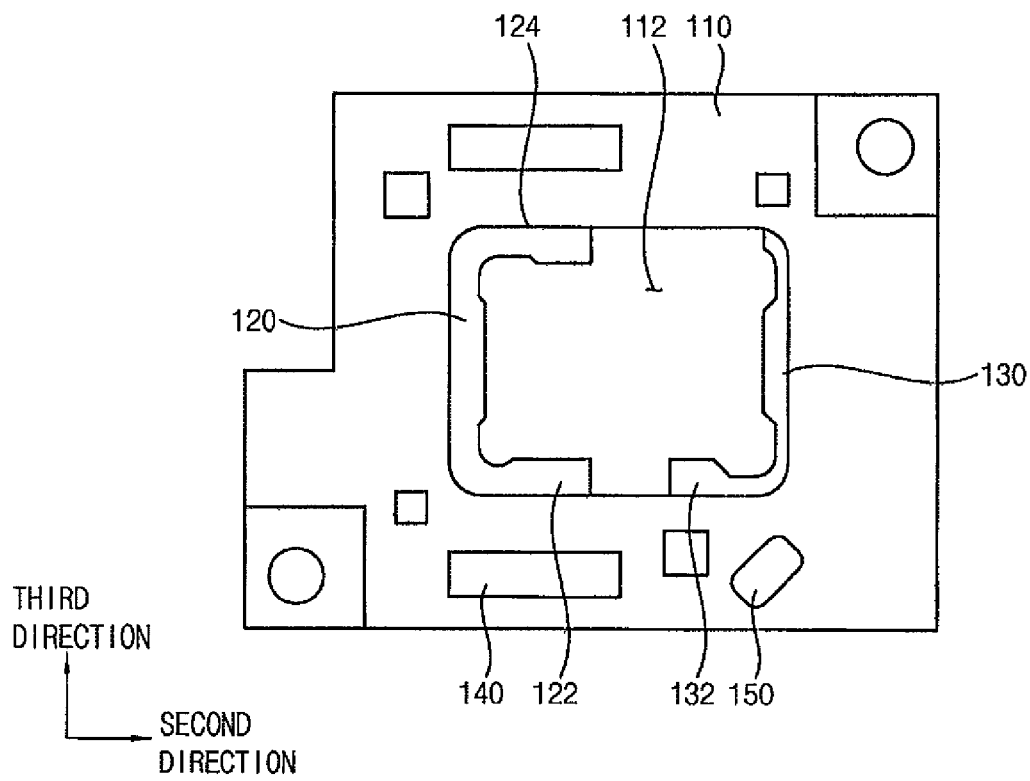
FIG. 5 is a bottom view of the adaptor in FIG. 2.
Figure 11:
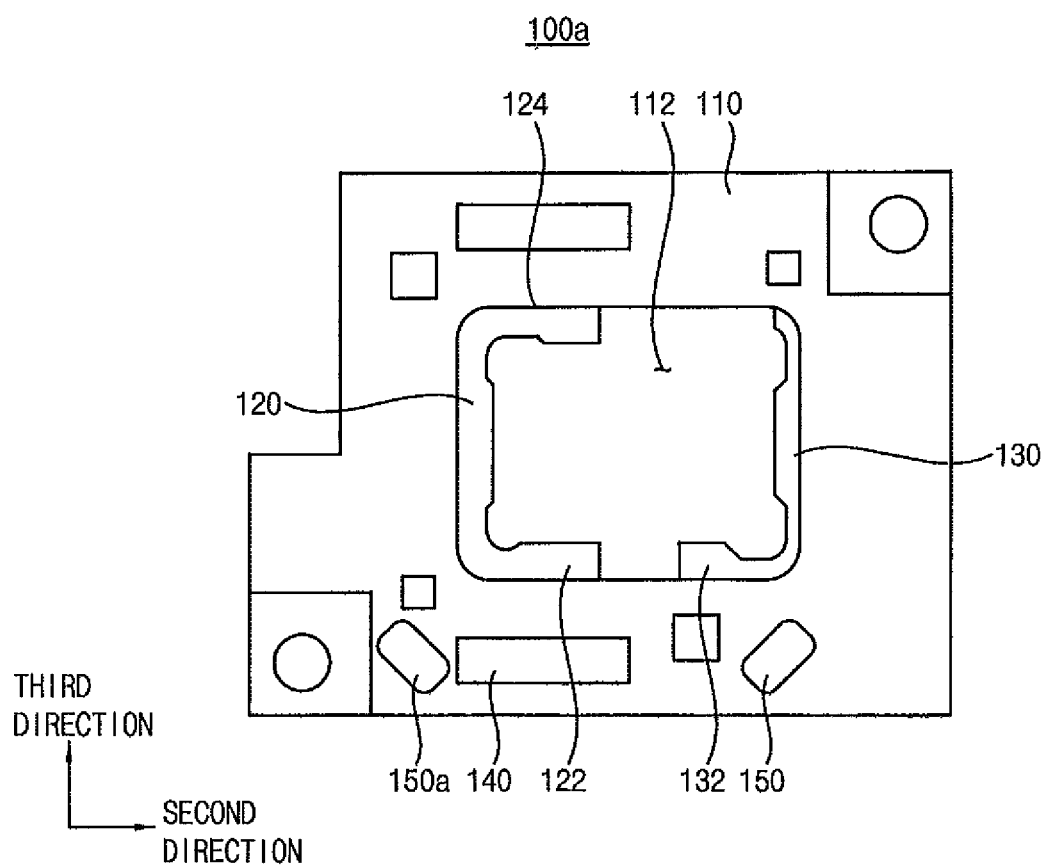
FIG. 11 is a bottom view illustrating an adaptor in accordance with example embodiments.

With reference to FIG. 11, an embodiment 100a of an adaptor may include elements substantially the same as those of the adaptor structure 100 in FIG. 2 except for further including a second adaptor-driving mechanism. Thus, the same reference numerals may refer to the same elements and any further illustrations with respect to the same elements may be omitted herein for brevity.

The first sub-adaptor 120 may be movably arranged in the opening 112 of the main adaptor 110 in the second direction as well as the first direction. Thus, the first sub-adaptor 120 may not be rigidly attached to the main adaptor 110.

The second adaptor-driving mechanism 150a may be arranged in the main adaptor 110. The second adaptor-driving mechanism 150a may move the first sub-adaptor 120 in the second direction. The second adaptor-driving mechanism 150a may have a structure substantially the same as that of the adaptor-driving mechanism 150 in FIG. 6A or FIG. 6B. Thus, any further illustrations with respect to the second adaptor-driving mechanism 150a may be omitted herein for brevity.

Figure 12:
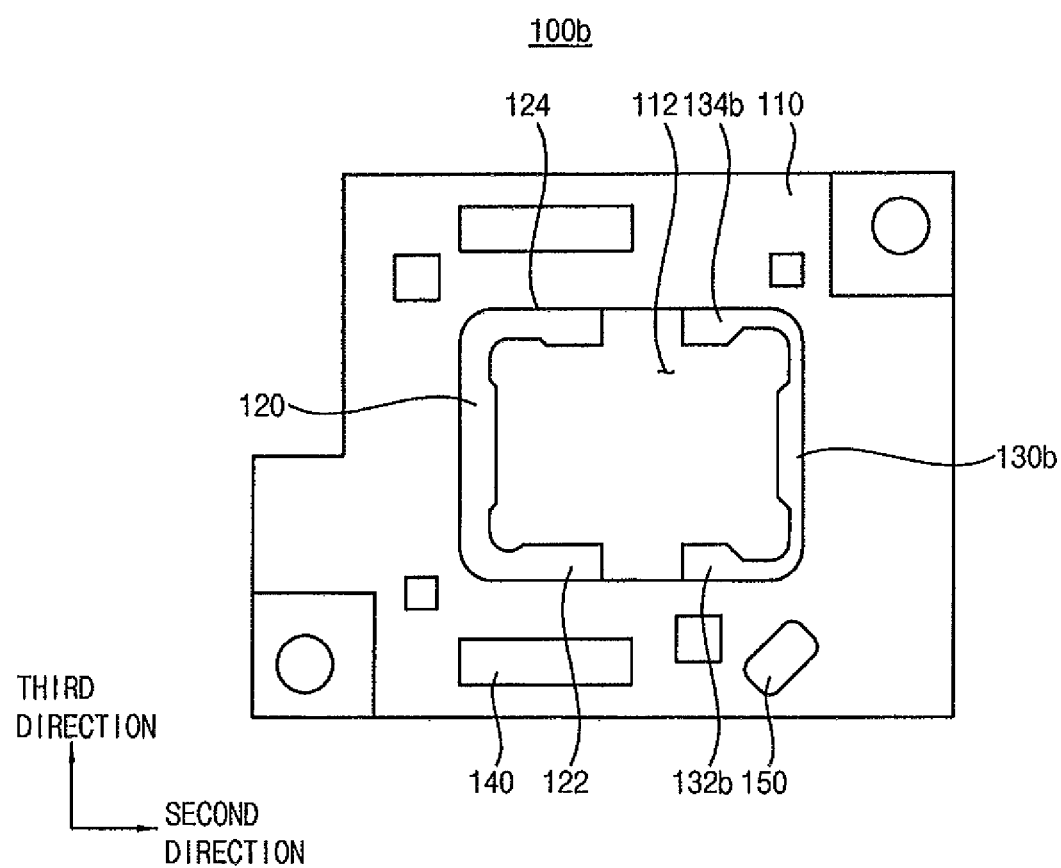
FIG. 12 is a bottom view illustrating an adaptor in accordance with example embodiments.

With reference to FIG. 12, an embodiment 100b of an adaptor may include elements substantially the same as those of the adaptor structure 100 in FIG. 2 except for a modification to the second sub-adaptor. Thus, the same reference numerals may refer to the same elements and any further illustrations with respect to the same elements may be omitted herein for brevity.

A second sub-adaptor 130b may include a third supporting portion 132b and a fourth supporting portion 134b. The fourth supporting portion 134b may be integrally formed with the second sub-adaptor 130b to support the fourth side surface of the semiconductor package.

Figure 13:
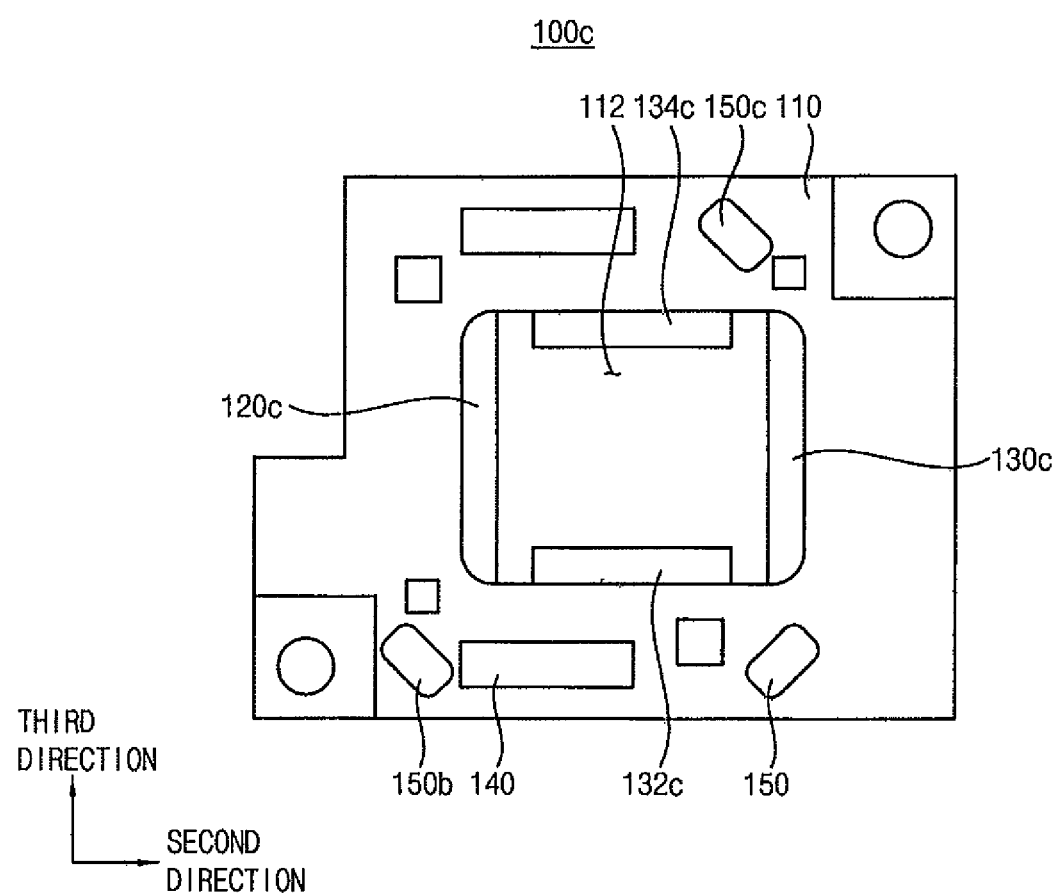
FIG. 13 is a bottom view illustrating an adaptor in accordance with example embodiments.

With reference to FIG. 13, an embodiment 100c of an adaptor may include elements substantially the same as those of the adaptor structure 100 in FIG. 2 except for further including third and fourth sub-adaptors. Thus, the same reference numerals may refer to the same elements and any further illustrations with respect to the same elements may be omitted herein for brevity.

An adaptor structure 100c of this example embodiment may include a first sub-adaptor 120c, a second sub-adaptor 130c, a third sub-adaptor 132c, a fourth sub-adaptor 134c, a first adaptor-driving mechanism 150, a third adaptor-driving mechanism 150b and a fourth adaptor-driving mechanism 150c.

The first sub-adaptor 120c may be arranged adjacent to the first side surface of the opening 112 of the main adaptor 110. The first sub-adaptor 120c may move in the opening 112 of the main adaptor 110 in the first direction. In contrast, the first sub-adaptor 120c may not move in the opening 112 of the main adaptor 110 in the second direction. The first sub-adaptor 120c may not include first and second supporting portions. Thus, the first sub-adaptor 120c may support only the first side surface of the semiconductor package.

The second sub-adaptor 130c may be arranged adjacent to the second side surface of the opening 112 of the main adaptor 110. The second sub-adaptor 130c may move in the opening 112 of the main adaptor 110 in the first and second directions. The second sub-adaptor 130c may not include a third supporting portion. Thus, the second sub-adaptor 130c may support only the second side surface of the semiconductor package. The first adaptor-driving mechanism 150 may move the second sub-adaptor 130e in the second direction.

The third sub-adaptor 132c may be arranged adjacent to the third side surface of the opening 112 of the main adaptor 110. The third sub-adaptor 132c may move in the opening 112 of the main adaptor 110 in the first direction, and a third direction substantially perpendicular to the first and second directions. The third sub-adaptor 132c may support the third side surface of the semiconductor package. The third adaptor-driving mechanism 150b may move the third sub-adaptor 132c in the third direction.

The fourth sub-adaptor 134c may be arranged adjacent to the fourth side surface of the opening 112 of the main adaptor 110. The fourth sub-adaptor 134e may move in the opening 112 of the main adaptor 110 in the first direction and the third direction. The fourth sub-adaptor 134c may support the fourth side surface of the semiconductor package. The fourth adaptor-driving mechanism 150c may move the fourth sub-adaptor 134c in the third direction.

The first adaptor-driving mechanism 150, the third adaptor-driving mechanism 150b and the fourth adaptor-driving mechanism 150c may have a structure substantially the same as that of the adaptor-driving mechanism 150 in FIG. 6. Thus, any further illustrations with respect to the first adaptor-driving mechanism 150, the third adaptor-driving mechanism 150 and the fourth adaptor-driving mechanism 150c may be omitted herein for brevity.

In example embodiments, the test apparatus may test the semiconductor package. Alternatively, the test apparatus including the adaptor may test electrical characteristics of other electronic devices.

According to example embodiments, the adaptor may include the separated first and second sub-adaptors. Further, the second sub-adaptor may be movably received in the opening of the main adaptor in the first and second directions. Thus, the adaptor structure may be capable of guiding the semiconductor packages having different sizes to the socket. Furthermore, the second sub-adaptor may have various positions in first to third directions so that the semiconductor package may not collide with the adaptor structure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An adaptor comprising:
a main adaptor over a socket for testing a semiconductor package, the main adaptor having an opening configured to expose the socket;
a first sub-adaptor received movably in the opening of the main adaptor along a first direction in which the semiconductor package is loaded into the socket, the first sub-adaptor configured to support a first side surface of the semiconductor package;
a second sub-adaptor received movably in the opening of the main adaptor along the first direction and a second direction substantially perpendicular to the first direction and towards the first sub-adaptor, the second sub-adaptor facing the first sub-adaptor to support a second side surface of the semiconductor package opposite to the first side surface of the semiconductor package; and
a first driving mechanism configured to move the second sub-adaptor in the second direction.

2. The adaptor of claim 1, wherein the first sub-adaptor comprises:
a first supporting portion extended from a first side surface of the first sub-adaptor in the second direction to support a third side surface of the semiconductor package connected between the first and second side surfaces of the semiconductor package; and
a second supporting portion extended from a second side surface of the first sub-adaptor opposite to the first side surface of the first sub-adaptor in the second direction to support a fourth side surface of the semiconductor package connected between the first and second side surfaces of the semiconductor package and facing the third side surface of the semiconductor package.

3. The adaptor of claim 1, wherein the second sub-adaptor comprises a third supporting portion extended from a first side surface of the second sub-adaptor in the second direction to support a third side surface of the semiconductor package connected between the first and second side surfaces of the semiconductor package.

4. The adaptor of claim 3, wherein the second sub-adaptor further comprises a fourth supporting portion extended from a second side surface of the second sub-adaptor opposite to the first side surface of the second sub-adaptor in the second direction to support a fourth side surface of the semiconductor package connected between the first and second side surfaces of the semiconductor package and facing the third side surface of the semiconductor package.

5. The adaptor of claim 1, wherein the first driving mechanism comprises:
a link movably received in the main adaptor in the first direction, the link including a lower end configured to selectively make contact with the socket, and a tapered upper end; and
a pusher extended from the second sub-adaptor in the second direction, the pusher configured to make contact with the tapered upper end of the link to move the second sub-adaptor in the second direction in response to movement of the link in the first direction.

6. The adaptor of claim 1, further comprising a return spring connected between the main adaptor and the second sub-adaptor to provide the second sub-adaptor with a restoring force in the first direction.

7. The adaptor of claim 1, further comprising:
a first magnet on the main adaptor; and
a second magnet on the second sub-adaptor,
wherein the first magnet and the second magnet generate a repulsive force to provide the second sub-adaptor with a restoring force in the first direction.

8. The adaptor of claim 1, wherein the first sub-adaptor is movably arranged in the opening of the main adaptor in the second direction, and the adaptor further comprises a second driving mechanism configured to move the first sub-adaptor in the second direction.

9. The adaptor of claim 8, wherein the second driving mechanism has a structure substantially the same as that of the first driving mechanism.

10. The adaptor of claim 1, further comprising:
a third sub-adaptor movably arranged in the opening of the main adaptor in a third direction substantially perpendicular to the first and second directions, the third sub-adaptor arranged substantially perpendicular to the first and second sub-adaptors to support a third side surface of the semiconductor package connected between the first and second side surfaces of the semiconductor package;
a third driving mechanism configured to move the third sub-adaptor in the third direction;
a fourth sub-adaptor movably arranged in the opening of the main adaptor in the third direction, the third sub-adaptor facing the third sub-adaptor to support a fourth side surface of the semiconductor package connected between the first and second side surfaces of the semiconductor package and facing the third side surface of the semiconductor package; and a fourth driving mechanism configured to move the fourth sub-adaptor in the third direction.

11. The adaptor of claim 10, wherein the third and fourth driving mechanisms comprise a structure substantially the same as that of the first driving mechanism.

12. The adaptor of claim 1, wherein the main adaptor comprises a push block configured to move the socket in the first direction.

13. A test apparatus comprising:
a socket configured to test a semiconductor package;
a main adaptor over the socket for testing the semiconductor package, the main adaptor having an opening configured to expose the socket;
a first sub-adaptor received movably in the opening of the main adaptor along a first direction in which the semiconductor package is loaded into the socket, the first sub-adaptor configured to support a first side surface of the semiconductor package;
a second sub-adaptor received movably in the opening of the main adaptor along the first direction and a second direction substantially perpendicular to the first direction and towards the first sub-adaptor, the second sub-adaptor facing the first sub-adaptor to support a second side surface of the semiconductor package opposite to the first side surface of the semiconductor package; and
an adaptor-driving mechanism configured to move the second sub-adaptor in the second direction.

14. The apparatus of claim 13, wherein the socket comprises:
a socket body;
a socket pin movably connected to the socket body in the second direction to selectively make contact with the semiconductor package;
a socket cover movably connected to the socket body in the first direction, the socket body pressed by the main adaptor to contact the semiconductor package with the socket pin and to operate the adaptor-driving mechanism; and
a socket-driving mechanism configured to move the socket pin in the second direction by a contact between the socket-driving mechanism and the socket cover.

15. The apparatus of claim 14, wherein the socket-driving mechanism comprises:

A link including an upper end connected to the socket cover, and a tapered lower end extended from the upper end in the first direction; and A pusher connected to the socket pin, the pusher configured to move the socket pin in the second direction by a contact between the pusher and the tapered lower end of the link.

16. A test apparatus comprising:
a socket including at least one pair of socket pins configured to electrically contact opposing sides of a respective one of a plurality of electrical terminals on a semiconductor package, each pair of socket pins including a respective fixed pin and a respective movable pin; and
an adaptor substantially collinear to the socket including a first contact surface separated from a second contact surface by an opening configured to receive the semiconductor package, the second contact surface configured to move towards the first contact surface to contact the semiconductor package on a second side opposing a first side contacted by the first contact surface, the respective movable pin moved by a compressive force on the socket from the adaptor, and the second surface moved by the compressive force on the adaptor from the socket.

17. The apparatus of claim 16 wherein the movable pin is moved in a direction orthogonal to the compressive force on the socket from the adaptor by a tapered link moving parallel to the compressive force.

18. The apparatus of claim 16 wherein the second surface is moved in a direction orthogonal to the compressive force on the adaptor from the socket by a tapered link moving parallel to the compressive force.

19. The apparatus of claim 16 wherein the second contact surface is configured to move towards the first contact surface by a tapered link moving parallel to the compressive force.

20. The apparatus of claim 16 wherein the opening includes a third contact surface and a fourth contact surface, the third contact surface configured to move towards a third side of the semiconductor package by a third tapered link moving parallel to the compressive force, the fourth contact surface configured to move towards a fourth side of the semiconductor package by a fourth tapered link moving parallel to the compressive force.

* * * * *